United States Patent [19]
Okino

[11] Patent Number: 5,989,753
[45] Date of Patent: Nov. 23, 1999

[54] METHOD, APPARATUS, AND MASK FOR PATTERN PROJECTION USING A BEAM OF CHARGED PARTICLES

[75] Inventor: Teruaki Okino, Kamakura, Japan

[73] Assignee: Nikon Corporation, Tokyo, Japan

[21] Appl. No.: 08/670,436

[22] Filed: Jun. 26, 1996

[30]     Foreign Application Priority Data

Jun. 26, 1995  [JP]  Japan ..................................... 7-159580
Jun. 6, 1996   [JP]  Japan ..................................... 8-144404

[51] Int. Cl.⁶ ....................................................... G03F 9/00
[52] U.S. Cl. .............................................. 430/5; 430/296
[58] Field of Search ........................................ 430/5, 296

[56]                     References Cited

U.S. PATENT DOCUMENTS 5,260,151  11/1993  Berger et al. ................................ 430/5
5,376,505  12/1994  Berger et al. ................................ 430/5
5,523,580   6/1996  Davis .......................................... 430/5

OTHER PUBLICATIONS

David A. Markle, Deep UV Lithography: Problems and Potential, SPIE vol. 774 Lasers in Microlithography Mar./(1987) pp. 108–114.

James P. Rominger, Seamless Stitching for Large Area Integrated Circuit Manufacturing, SPIE vol. 992, Optical/Laser Microlithography May/(1988).

*Primary Examiner*—S. Rosasco
*Attorney, Agent, or Firm*—Cushman Darby & Cushman IP Group of Pillsbury Madison & Sutro LLP

[57]                     ABSTRACT

In order to make it possible to suppress projection errors in the portions of patterns which are connected together, in a method of pattern projection which includes a process of making a pattern of a beam of charged particle, in which a beam of charged particles is irradiated upon a small region upon a mask and the beam of charged particles is caused to change by the influence of pattern which is provided on the selected small regions, a process of projection in which the patterns of the beam of charged particles are projected upon a certain portion of a projection reception region which is defined upon a sensitive plate, a process of scanning in which the small region and the certain portion are selected in sequence, the patterns of the selected small regions are projected upon the selected certain portions and connected in sequence, a process of irradiation amount reduction is performed, during the scanning process, the amount of irradiation by the beam of charged particles of the peripheral portion of the selected of small regions is reduced in correspondence to the distance from the center of the selected small regions. From a pair of projection reception regions upon the sensitive plate which mutually neighbor one another, the regions for which the amount of irradiation by the beam of charged particles is reduced are mutually superimposed.

12 Claims, 16 Drawing Sheets

FIG. 10C
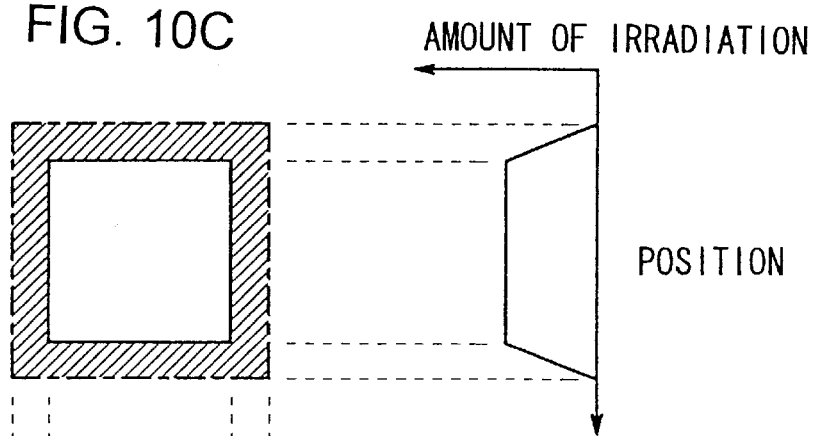
FIG. 10E
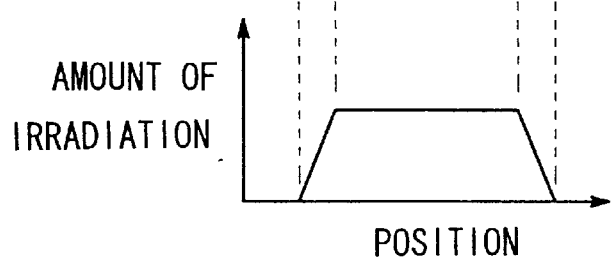
FIG. 10D

METHOD, APPARATUS, AND MASK FOR PATTERN PROJECTION USING A BEAM OF CHARGED PARTICLES

BACKGROUND OF THE INVENTION

1. Field of the Invention

The present invention relates to a pattern projection method, a pattern projection apparatus, and a pattern projection mask which are used in lithography for semiconductor integrated circuits or the like, and more particularly relates to such a pattern projection method, apparatus, and mask which image a pattern upon the mask onto a sensitive plate by utilizing irradiation with a beam of charged particles such as an electron beam or an ion beam.

2. Description of the Related Arts

Recently investigation and development of electron beam exposure devices for lithography with which both high throughput and high resolution can be obtained. As methods of exposure for this type of device, in the prior art, methods have been studied in which one or a plurality of dies (each one of which corresponds to a plurality of integrated circuits which are formed upon a single wafer) are imaged as a group. However, with such a method, the fabrication of the mask, which is intended as the master for projection, presents certain problems. Also it is difficult to restrict to an acceptable range the aberration of the optical system over a large optical field such as is required for more than one die, etc., so that there are a lot of problems to be resolved. In this connection, recently a subdivided projection method has been investigated (for example, refer to U.S. Pat. No. 5,260,151 in which one or a plurality of dies are subdivided into small regions which are then imaged). According to such a method, since the range over which irradiation by the electron beam is required to be performed at one time is relatively small, it is possible to restrict the aberration of the optical system, and thereby projection at high resolution and with high accuracy becomes possible.

With the above described subdivided projection method, the pattern which is provided is subdivided into a plurality of regions on the mask, and images thereof are connected together upon the wafer so as to form one continuous connected pattern. Accordingly, there is a danger that deviations of the positions for projection each time from the positions which were intended, and therefore mutual misalignment of the connecting portions of the pattern, may occur, due for example to optical distortion of the small regions on the mask, wobbling of the stages which move the mask and the wafer, electrical fluctuations, errors in the manufacture of the mask, etc . . . For example, if this type of deviation occurs when imaging a wiring pattern, the electrical resistance of the deviated portion is altered, and the characteristics of the device which is obtained become unpredictable.

SUMMARY OF THE INVENTION

Accordingly, the objective of the present invention is to provide a method and apparatus for pattern projection which are capable of suppressing projection errors in the connecting portions of the patterns, utilizing a mask which is specially adapted to be suitable for this method and apparatus.

In order to attain this objective, the present invention proposes, a method for pattern projection using a beam of charged particles, comprising:

a process of making a pattern of a beam of charged particle wherein a beam of charged particles is irradiated upon a small region which is selected among a plurality of small regions upon a mask, and the beam of charged particles is caused to change by the influence of a pattern which is provided on the small region; a process of projection, wherein the pattern of the beam of charged particles is projected upon a certain portion of a projection reception region which is defined upon a sensitive plate, whereby the pattern of said small region is imaged upon said certain portion; a process of scanning, wherein said small region and said certain portion which corresponds thereto are selected in sequence, the patterns of said selected small regions are projected upon said selected certain portions, and a predetermined pattern is formed upon said sensitive plate by connecting said projected pattern in sequence, and a process of irradiation amount reduction, wherein, during the projection of said pattern of said selected small region on said scanning process, the amount of irradiation by said beam of charged particles of the peripheral portion of each one of said plurality of small regions is steadily reduced in correspondence to the distance from the center of said one of said small regions; wherein said small regions on said mask and said certain portions of said transcription reception regions on said sensitive plate are scanned so as to establish a mutual correspondence so that at least portions of the regions for which the amount of irradiation by said beam of charged particles is reduced by said process of irradiation amount reduction, from a pair of said certain portions of said projection reception regions upon said sensitive plate which mutually neighbor one another, are mutually superimposed. And the objective detailed above is thereby fulfilled.

Further, in order to attain the above detailed objective, the present invention proposes, an apparatus for pattern projection using a beam of charged particles, comprising: an irradiation device which can irradiate each of a plurality of small regions upon a mask individually and selectively with a beam of charged particles; an image formation device which directs at least a portion of the beam of charged particles after passing through the small regions upon the mask onto a sensitive plate; an irradiation position adjustment device which adjusts the position of irradiation of the beam of charged particles upon the sensitive plate so as mutually to connect together the irradiation receiving regions upon the sensitive plate which correspond respectively to the plurality of small regions; and an irradiation amount reduction means for steadily reducing the amount of irradiation by the beam of charged particles of the peripheral portion of each one of the plurality of small regions in correspondence to the distance from the center of the one of the small regions. And the objective detailed above is thereby fulfilled.

Further, in order to attain the above detailed objective, the present invention proposes a mask for pattern projection using a beam of charged particles which comprises a plurality of small regions, a pattern being provided upon each of the plurality of small regions which imparts a predetermined alteration to a beam of charged particles after passing through the small region; wherein, upon the peripheral portions of a pair of the small regions upon which patterns which should be continuous with one another are provided, the pattern is repeated for superimposition. And the objective detailed above is thereby fulfilled.

According to an alternative aspect of the present invention, there is proposed a mask for pattern projection using a beam of charged particles, comprising a mask base plate and a support structure which supports the mask base plate and separates the mask base plate into a plurality of small regions; and wherein in the small regions there are provided first regions through which the beam of charged particles passes, and second regions in which the degree of absorption or of scattering of the beam of charged particles is greater than in the first regions, with the first regions contacting the boundaries between the small regions and the support structure. This structure also accomplishes the above described objective.

According to yet another aspect of the present invention, there is proposed a mask for pattern projection using a beam of charged particles, comprising a mask base plate which is formed as a thin sheet, a support structure which supports the mask base plate and which separates the mask base plate into a plurality of small regions, and an irradiation control member which is disposed in the small regions of the mask base plate and which absorbs or scatters the beam of charged particles more than does the mask base plate; and wherein transparent regions in which the irradiation control member does not exist are provided which contact the boundaries between the small regions and the support structure. This structure also accomplishes the above described objective.

The pattern projection method according to the present invention will now be explained with reference to FIGS. 1 through 3. However, it should be understood that the present invention is not to be limited by the particular features of the drawings, which are only provided for the purposes of illustration. FIG. 3A shows a case of application of the pattern projection method according to the present invention, and in this figure the reference numeral 100 denotes a mask, while 110 denotes a sensitive plate. Moreover, the z axis is taken along the direction of the optical axis AX of an optical system for a beam of charged particles, while the x and y axes are taken along mutually perpendicular directions in a plane which is parallel to the mask 100 and the sensitive plate 110. A plurality of small regions 100a are provided upon the mask 100 arranged in series along the x and y axis directions with margins 100b of a specific width separating them. The sensitive plate 110 may, for example, be constituted by the surface of a silicon wafer upon which is spread a resist which is sensitive to a beam of charged particles EB such as an electron beam. With lithography for semiconductor integrated circuitry or the like, the sensitive plate 110 is divided up into a plurality of regions 110a as shown in FIG. 3B, and one of these regions 110a is dealt with as a range for projection of a fixed unit pattern, for example one die of an integrated circuit. Furthermore, the portion IIIa in FIG. 3B of the sensitive plate 110 is shown in FIG. 3A as magnified.

The pattern which is to be provided upon one of the regions 110a of the sensitive plate 110 is provided in the small regions 100a of the mask 100 as subdivided. In the scanning process, each small region 100a is scanned stepwise by the beam of charged particles EB, for example in the order shown in the figure by the path R. Simultaneously with this scanning process, an image formation process is performed in which in order at least a portion of the beam of charged particles after passing through each of the small regions 100a is directed upon those of projection reception regions 110b, from among a plurality of projection reception regions 110b which are defined upon this region 110a of the sensitive plate 110, which respectively correspond to these small regions 100a. The projection reception regions 110b upon which the beam of charged particles is directed in the order of scanning which is for example as shown in the figure by the path R are altered in the order as shown by the path R'. The directions of the paths R and R' are mutually opposite due to the operation of the image formation optical system (not particularly shown) which is provided between the mask 100 and the sensitive plate 110. In order for the projection reception regions 110b not to be separated from one another by images of the margins 100b of the mask 100 being formed upon the sensitive plate 110, the position at which the charged particle beam EB irradiates the sensitive plate 110 is adjusted, for example by a deflector (not particularly shown). Accordingly, the patterns in each of the small regions 100a are joined together in the region 110a of the sensitive plate 110, so that one continuous pattern is imaged. Moreover, "CO" denotes the crossover point of the charged particle beam which has passed through the mask 100.

The process of irradiation amount reduction according to the present invention will be explained with reference to FIGS. 1A–1C and 2A–2D. A, B, C, and D in FIGS. 1A–1C are four of the small regions from among the small regions 100a on the mask 100 shown in FIGS. 3A and 3B, provided at any arbitrary position thereupon. In the process of irradiation amount reduction, the amount of irradiation provided by the beam of charged particles for each of the peripheral portions 100x (the regions shown by hatching) within each of the small regions A, B, C, and D is reduced in accordance with the distance from the center of the respective small region A, B, C, or D. An example of a typical (linear) relationship between the amount of irradiation and the position in a peripheral portion 100x is shown in FIG. 1B. And, if it is supposed that the four small regions A, B, C, and D of FIG. 1A respectively correspond to four mutually adjoining projection reception regions A', B', C', and D' upon the sensitive plate 110 as shown in FIG. 1C, then, according to the present invention, at least certain portions of the regions from these projection reception regions A', B', C', and D' in which the amount of irradiation by the beam of charged particles is reduced due to the above described irradiation amount reduction process are mutually overlapped. Moreover, in FIG. 1C, the projection reception regions A' and D' are shown by solid lines and the projection reception regions B' and C' are shown by dashed lines, while the portions of these projection reception regions A', B', C', and D' which are mutually overlapped are shown by hatching.

The action by which the projection reception regions are joined together when the above processes are performed will now be explained with reference to FIGS. 2A–2D. It will be supposed that, as shown in FIG. 2A, a line pattern LP which is perpendicular to the direction of the margin between the projection regions A' and B' is imaged upon the joining portions of a mutually adjoining pair of the projection reception regions upon the sensitive plate 110, for example the projection reception regions A' and B' shown in FIG. 1C. In this case, due to the influence of the above described irradiation amount reduction process, as shown in FIG. 2B, over a predetermined range x from the edges of each of the regions A' and B', the amount of accumulated energy of the beam of charged particles gradually decreases towards the outside of each of the regions A' and B'. When these predetermined ranges x from the edges of each of the regions A' and B' are mutually overlapped, the energy of the beam of charged particles accumulated over the range x is equal to the sum of the accumulated energies over the range x for each of the regions A' and B', and as shown by the dashed line in FIG. 2C its value is almost equal to its value in the portions of the projection reception regions A' and B' which do not experience any influence from the above described irradiation amount reduction process. Due to this type of superposition, even if the projection reception region A' and/or B' deviates somewhat, the line pattern LP is smoothly and continuously joined together as shown in FIG. 2D. Moreover, desirably, the positions at which the amount of irradiation by the beam of charged particles drops to ½ upon the projection reception regions A' and B' should mutually coincide upon the sensitive plate 110.

When a pattern was imaged onto the projection reception regions A' and B' using a prior art method not accompanied by the above described irradiation reduction process, the accumulated energy of the beam of charged particles decreased abruptly in the vicinity of the border between the regions A' and B', as shown by the solid line in FIGS. 12A–12C, even considering energy losses from the surface of the sensitive plate due to reflection of the electrons or the like. Accordingly, as shown in FIG. 12A, if the region A' and/or the region B' becomes displaced in the direction to separate them due to positional deviation or the like, then as shown by the dashed line in FIG. 12B the sum total of the accumulated energy in the border region drops below the development level DL (shown by the single dotted chain line in the figure), and as shown in FIG. 12C there is a high risk of the line pattern LP becoming broken.

According to the method of the present invention, since the amount of irradiation by the beam of charged particles in the peripheral portions within the plurality of small regions of the mask is reduced, and since it is arranged that the projection of the pattern is performed while superimposing the ranges over which in correspondence with this the level of irradiation by the beam of charged particles upon the sensitive plate is reduced, accordingly the pattern can be smoothly connected together between adjoining ones of the projection reception regions, and therefore the characteristics of the devices which are thereby produced can be enhanced.

According to the apparatus of the present invention, by the operation of the irradiation amount reduction device, it is possible to reduce the amount of irradiation by the beam of charged particles of the peripheral portions within the small regions of the mask towards their outsides. Accordingly it is possible to implement easily the pattern projection method of the present invention by establishing a correspondence between the small regions of the mask and the projection reception regions of the sensitive plate, so as to obtain a desired pattern when mutually superimposing the peripheral portions of the projection reception regions of the sensitive plate. According to one aspect of the mask of the present invention, since the patterns on the peripheral portions of a pair of the small regions on which the patterns provided must be mutually connected together are compatible, therefore it is possible to implement the pattern projection method of the present invention by reducing the amount of irradiation by the beam of charged particles of these peripheral portions towards the outsides of their small regions, along with mutually superimposing the peripheral portions within the projection reception regions on the sensitive plate which correspond to these small regions.

According to another aspect of the mask of the present invention, the pattern is provided as crossing almost all the boundaries of the small regions which are surrounded by the support structure. Moreover, according to the pattern projection method of the present invention, since the amount of irradiation by the beam of charged particles is diminished steadily over the peripheral portions of each of the small regions, accordingly even if the range of irradiation by the beam of charged particles is set right up to the vicinity of the position of the boundary between the support structure and the small regions, irradiation of the support structure by the beam of charged particles almost does not occur, and accordingly, no problem of deterioration of the accuracy of projection, or the like arises.

BRIEF DESCRIPTION OF THE DRAWINGS

FIGS. 10A–10E are figures for explanation of the operation of this second preferred embodiment of the method of the present invention;

DESCRIPTION OF THE PREFERRED EMBODIMENTS

Preferred Embodiment 1

Figure 1A:
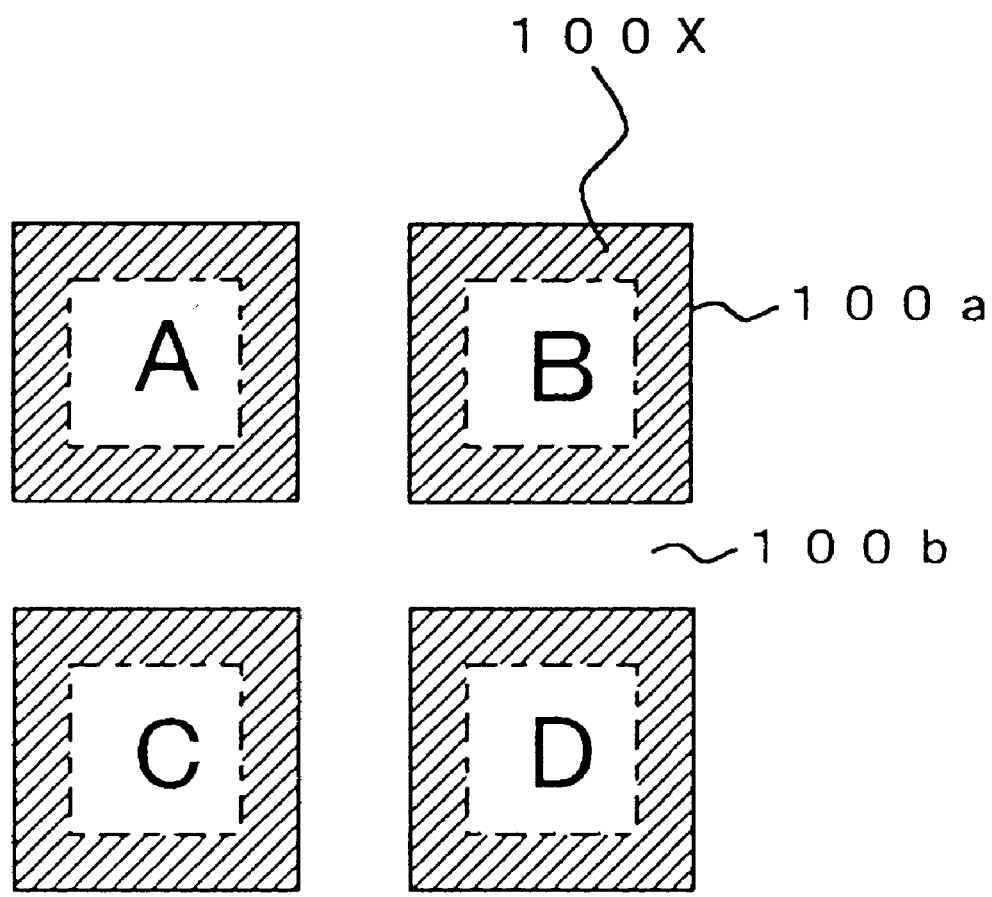
FIGS. 1A–1C are figures showing a process for irradiation amount reduction according to the method for pattern projection of the present invention.
Figure 1B:
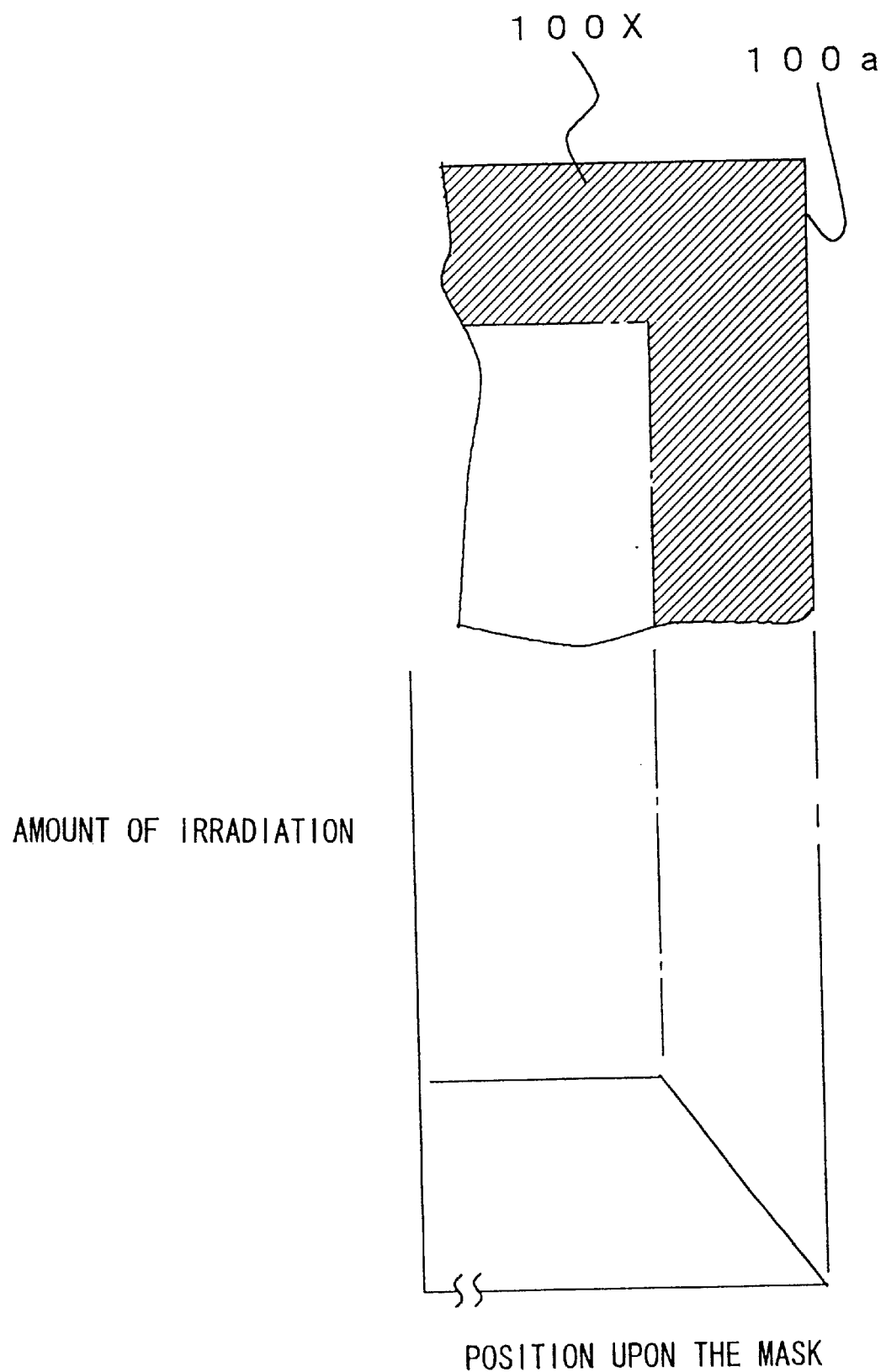
Figure 1C:
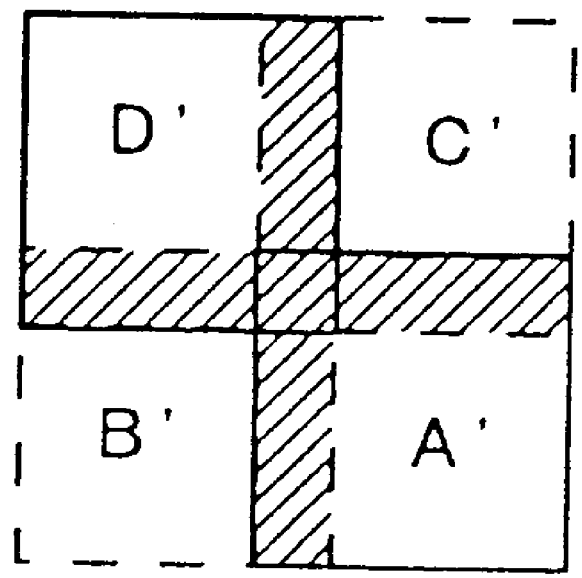
Figure 2A:
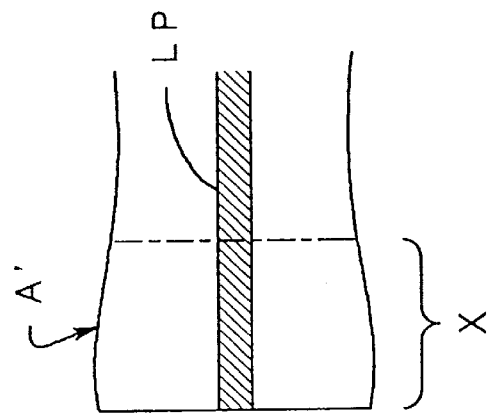
FIGS. 2A–2D are figures for the explanation of the operation of the present invention.
Figure 2B:
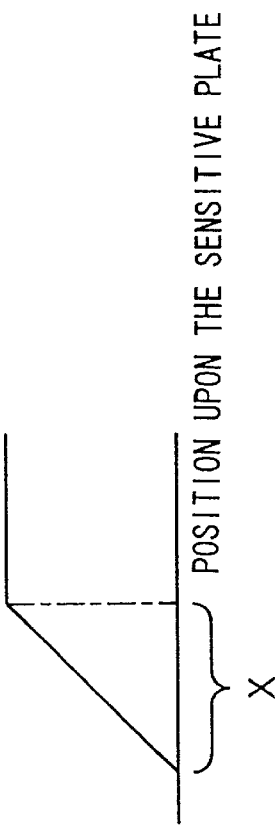
Figure 2B:
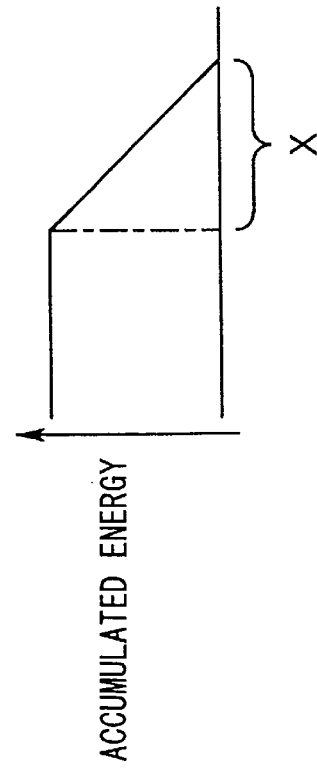
Figure 2C:
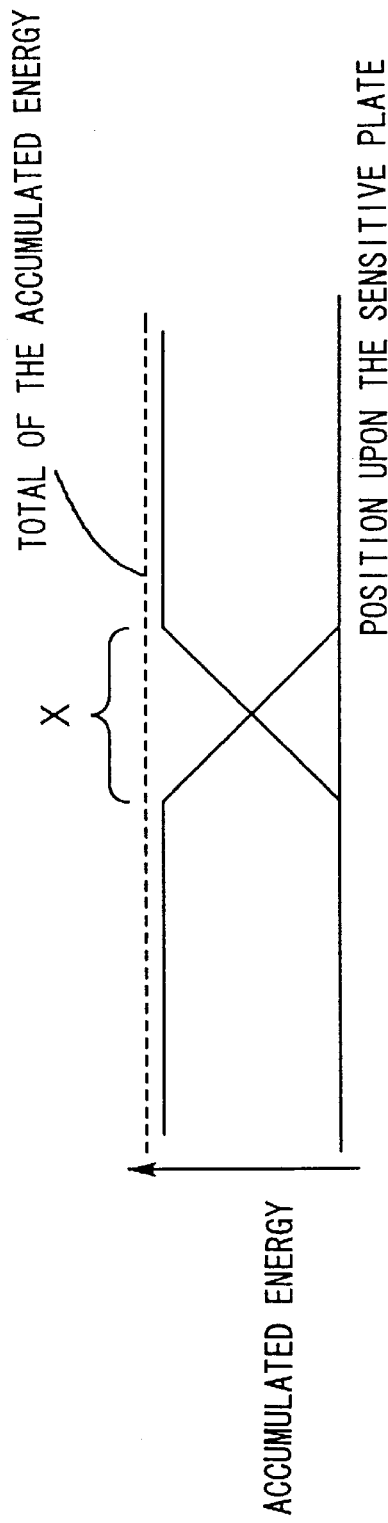
Figure 2D:
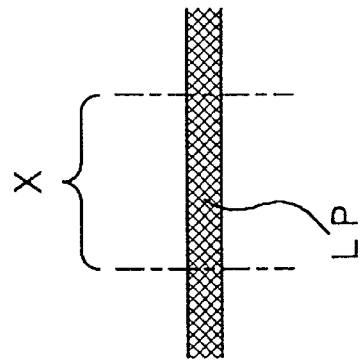
Figure 3A:
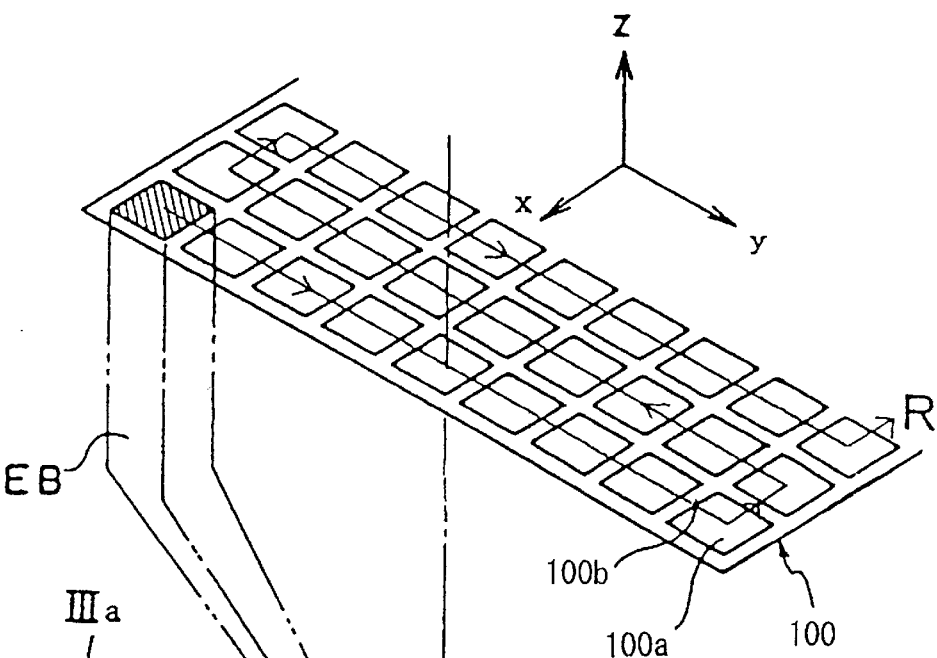
FIGS. 3A and 3B are perspective views schematically showing a scanning process and an image formation process according to the method for pattern projection of the present invention.
Figure 3B:
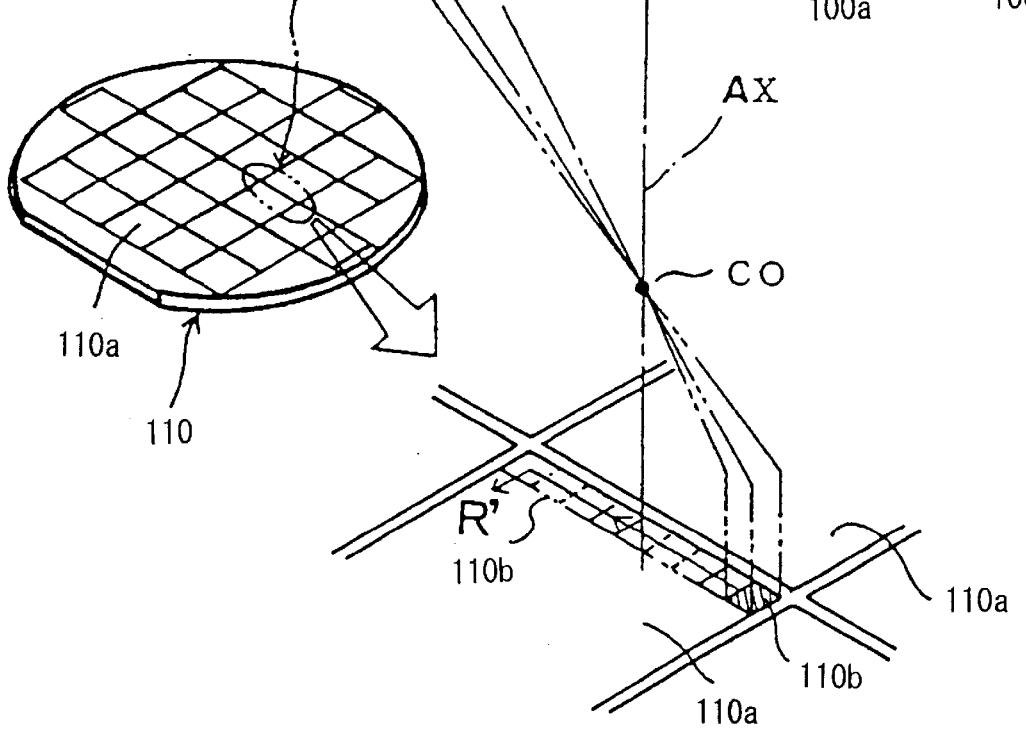
Figure 4:
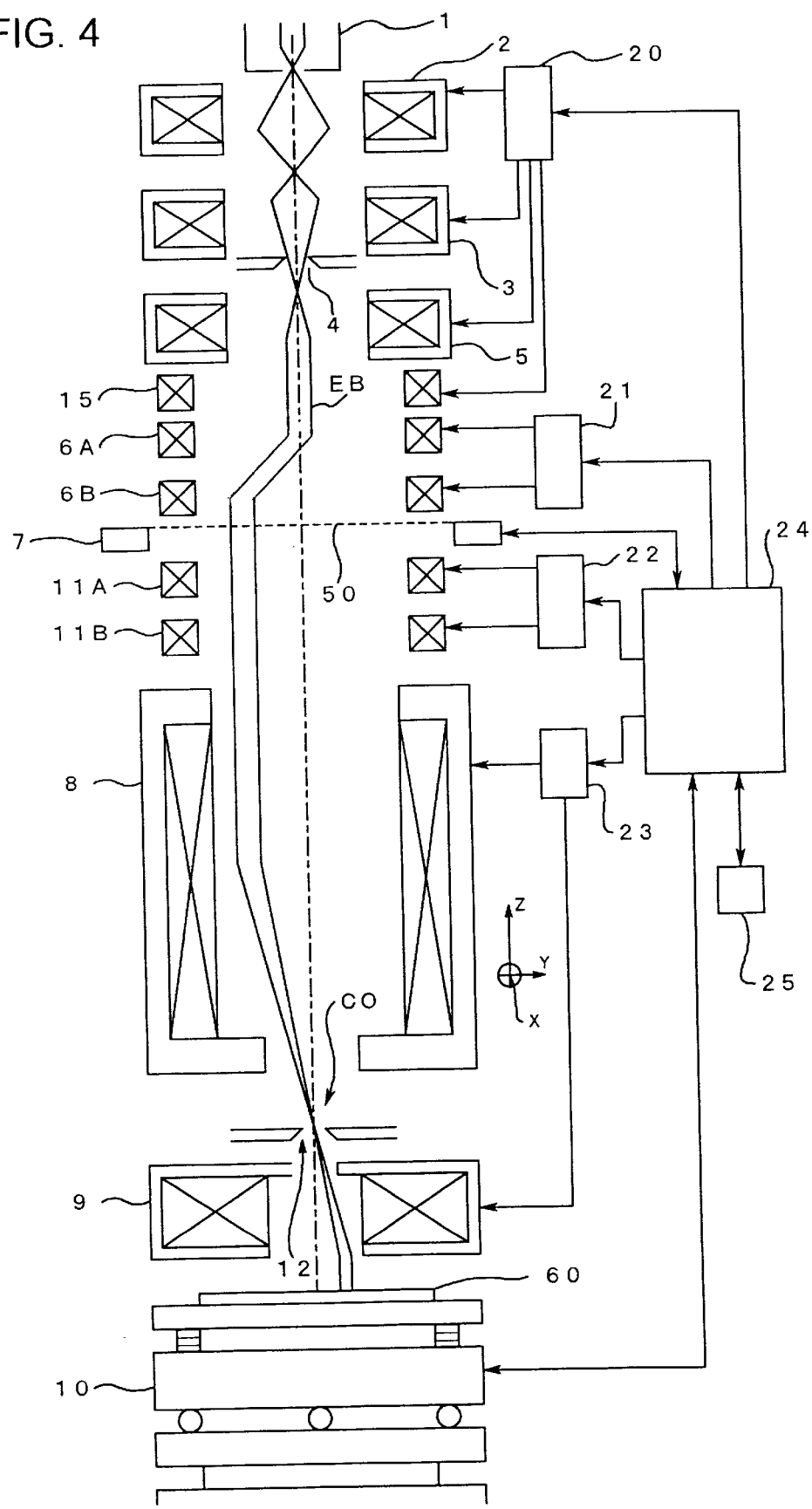
FIG. 4 is a schematic view of an electron beam projection apparatus according to a first preferred embodiment of the apparatus of the present invention.

The first preferred embodiments of the method, apparatus, and mask for pattern projection using a beam of charged particles according to the present invention will now be explained with reference to FIGS. 4 through 8. First, a summary of the electron beam reduction projection apparatus which constitutes the first preferred apparatus embodiment will be explained with reference to FIG. 4. The directions in which the x, y, and z axes are taken in FIG. 4 agree with their directions in FIGS. 3A and 3B as described previously (the x axis is perpendicular to the plane of the drawing paper). In FIG. 4, the reference numeral 1 denotes an electron gun, and an electron beam EB emitted thereby is focused by condenser lenses 2 and 3 and is trimmed by a first aperture 4 into a beam of rectangular cross sectional form.

After this trimming, the electron beam EB is further regulated by another condenser lens 5 into a beam which is parallel to the optical axis AX of the electron gun 1, is then deflected to a certain amount by a pair of deflectors 6A and 6B, and is then incident upon a predetermined region of a mask 50 which is mounted upon a mask stage 7. The mask 50, which is the first preferred embodiment of the mask of the present invention, will be explained hereinafter. A rotating lens 15 is disposed in the space between the first aperture 4 and the mask 50, and rotates the image of the first aperture 4 which is focused upon the mask 50. The deflector 6A is made from a combination of two groups of deflector coils which generate magnetic fields in specific directions which are perpendicular to the z axis, arranged so that their directions of deflection are different from one another. The second deflector 6B is formed so as to be substantially identical to the first deflector 6A. By regulating the flows of electrical current which are supplied to the deflector coils comprised in each of these coil groups of the deflector 6A, the electron beam EB can be deflected in any direction in the plane perpendicular to the z axis, as desired; and similarly for the deflector 6B.

The electron beam EB, after passing through the mask 50 then passes through a pair of image formation lenses 8 and 9 and is incident at a specific determinate position upon a wafer 60 which is fixed upon a wafer stage 10 and which consists of a sensitive plate. The image formation lenses 8 and 9 are arranged so as to constitute an image reducing optical system, and the reduction ratio which they provide may be set, for example, to ¼. The wafer stage 10 can be shifted to and fro along the x and y axis directions, so as to shift the wafer 60 accordingly. A pair of deflectors 11A and 11B are provided between the mask stage 7 and the wafer stage 10 in order to allow adjustment of the position of incidence of the electron beam EB upon the wafer 60. These deflectors 11A and 11B are generally identical to the deflectors 6A and 6B. In the vicinity of the crossover point CO of the electron beam EB generated by the image formation lenses 8 and 9 there is provided a second aperture 12 in order to prevent incidence upon the wafer 60 of beam electrons which have been scattered by the mask 50 by more than a predetermined amount. The reference numeral 20 denotes a source of electrical power for powering and controlling the condenser lenses 2, 3, and 5 and the rotating lens 15, while 21 is a source of electrical power for powering and controlling the deflectors 6A and 6B, 22 is a source of electrical power for powering and controlling the deflectors 11A and 11B, and 23 is a source of electrical power for powering and controlling the image formation lenses 8 and 9. The output of electrical current from each of these control power sources 20 through 23 is controlled by a control device 24. This control device 24 also controls the movement of the mask stage 7 and of the wafer stage 10. 25 is a memory device for the control device 24, and various data which is necessary for the control device 24 for various types of control during projection is stored therein.

Figure 5:
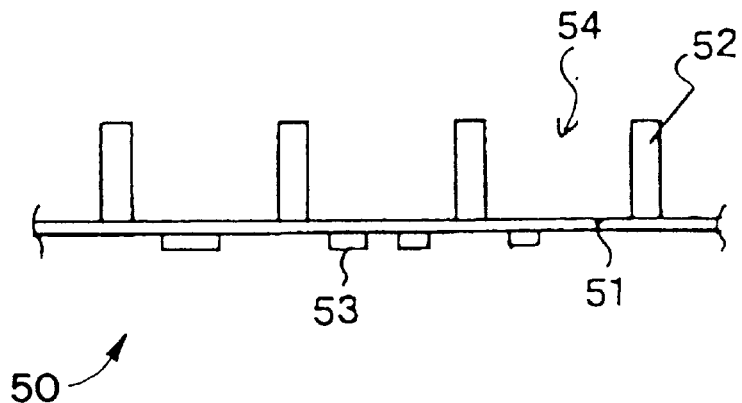
FIG. 5 is a cross sectional view of a mask according to a preferred embodiment of the mask of the present invention, which is used in the device of FIG. 4.
Figure 6:
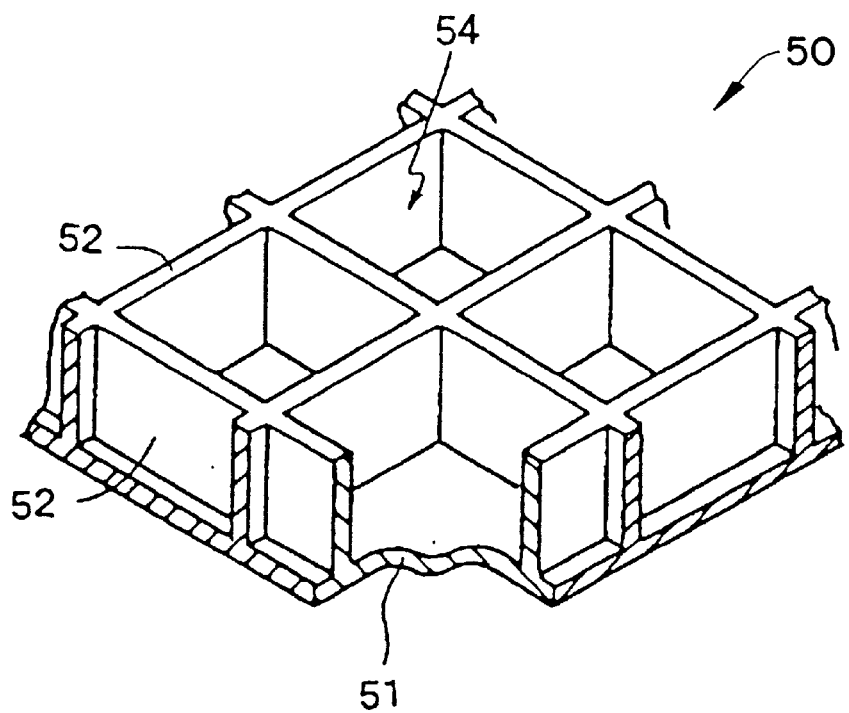
FIG. 6 is a perspective view of the mask of FIG. 5 as seen from above.
Figure 7:
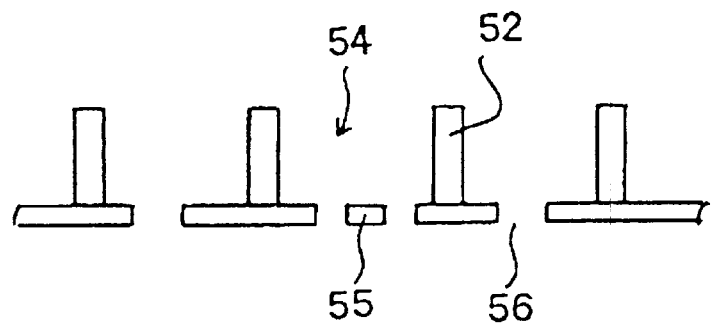
FIG. 7 shows an alternative type of mask which can be used, according to an alternative preferred embodiment of the mask of the present invention.

FIG. 5 is a cross sectional view of the mask 50, according to the first preferred embodiment of the mask of the present invention, while FIG. 6 is a perspective view thereof. As shown in these figures, the mask 50 comprises a mask base plate 51 which is formed as a plate thinned down to a few microns in thickness so as to allow the electron beam to pass through it, a supporting post(strut) 52 in the form of a grating, which supports this mask base plate 51 from its one side (the upper side in the figures), and a limitation member 53 which scatters the electron beam more than does the mask base plate 51. The small regions 54 of rectangular shape which are surrounded by the walls of the supporting post 52 correspond to the small regions 100a of FIGS. 3A and 3B, and a desired pattern is defined upon the appropriate ones of these small regions 54 using the irradiation limitation member 53. That is to say, with the projection device of FIG. 4, since the larger part of the electron beam which is scattered by the irradiation limitation member 53 is intercepted by the surrounding portion of the second aperture 12 and thus is not incident upon the wafer 60, therefore the limitation member 53 is arranged so as to correspond to the form of the portion of the electron beam which is not required to be incident upon the wafer 60. Moreover, when the acceleration voltage by which the mask 50 is exposed is small, the electron beam is completely absorbed by the irradiation limitation member 53. As shown in FIG. 7, it would also be acceptable, as an alternative, to use a so called stencil type mask in which cutout holes 56 were formed in a mask plate 55 corresponding to the pattern for projection. In this case, the mask plate 55 should be formed substantially thicker than the mask base plate 51 of the FIG. 5 structure, as appropriate, so as to absorb almost completely the electron beam, or alternatively so as to scatter it greatly.

Figure 8A:
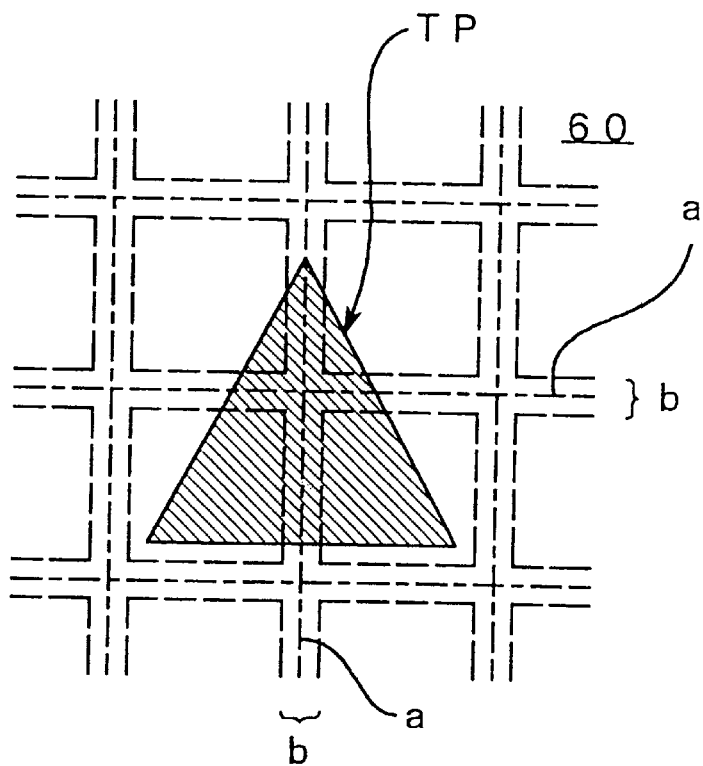
FIGS. 8A–8C are figures showing the relationship between a pattern which is to be imaged onto a wafer and a pattern provided upon the mask of FIG. 5, with the preferred embodiments of the present invention.
Figure 8B:
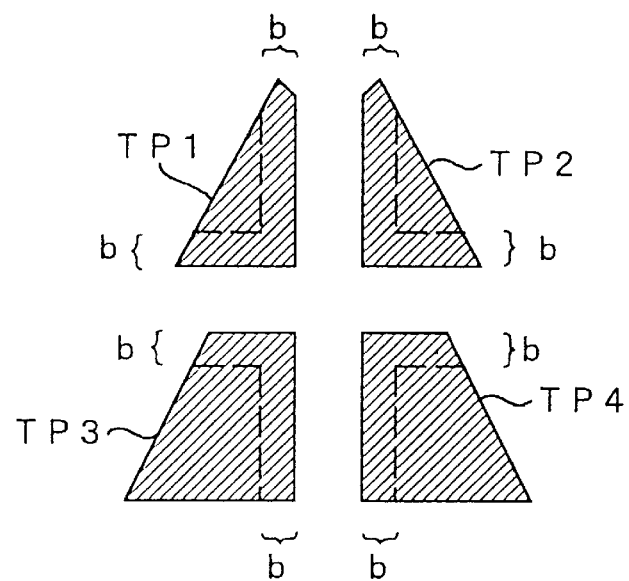
Figure 8C:
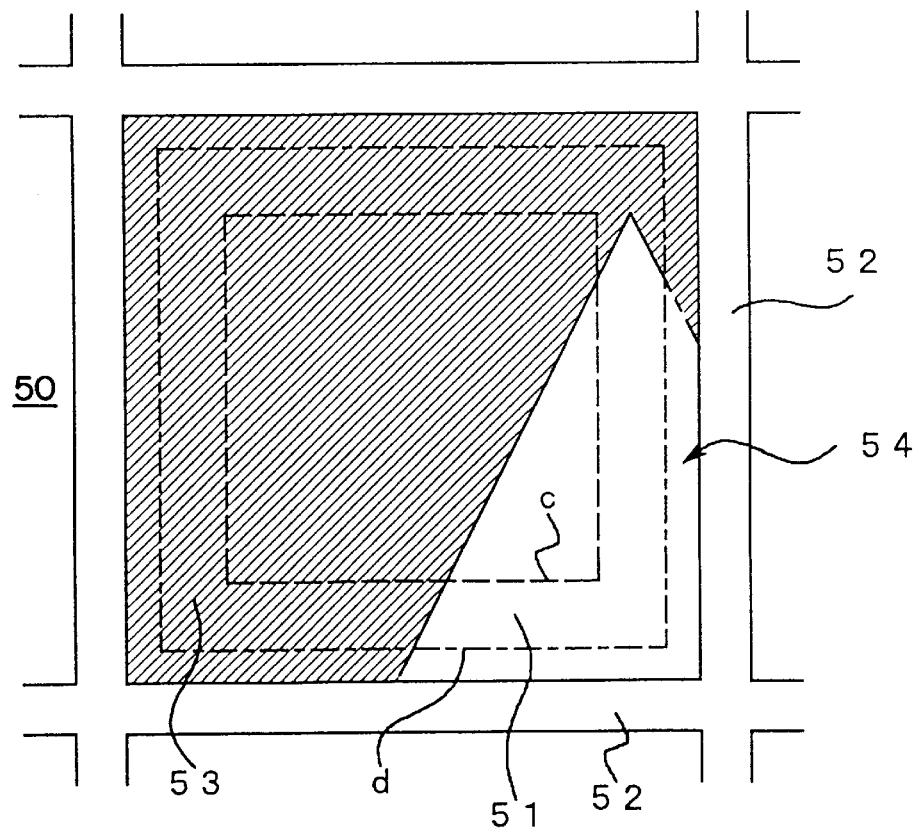
Figure 9:
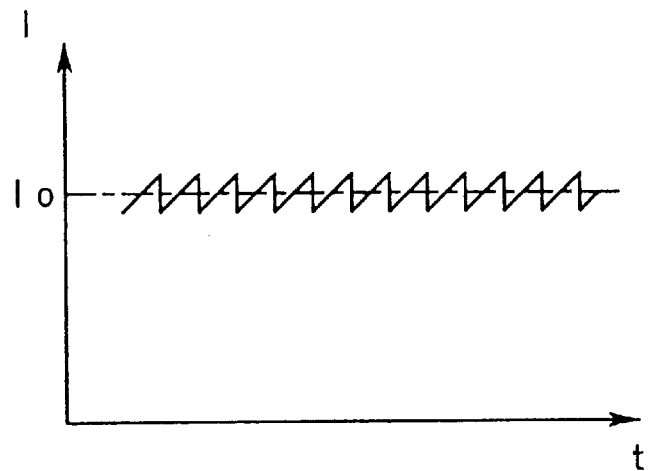
FIG. 9 is a figure showing an example of a high frequency saw-tooth waveform for an electrical current which is supplied to a deflector during the practice of the second preferred embodiment of the method of the present invention.

The relationship between the pattern which is to be imaged onto the wafer 60 and the patterns provided in the small regions 54 of the mask 50 may, for example, be set as shown in FIGS. 8A–8C. As shown in FIG. 8A, if a triangular pattern TP is to be imaged onto the wafer 60, in the prior art it was hypothesized that the pattern TP was divided along separation lines "a" as shown by the single dotted chain lines. On the other hand, with these first preferred embodiments of the method and apparatus according to the present invention, as shown by the broken lines in the figure, an overlapping projection range b is set at a predetermined width on either side of these basic separation lines a, and next, as shown in FIG. 8B, the pattern TP is divided into a plurality of (in the figure, as an example, four) subpatterns TP1, TP2, TP3, and TP4 which include mutually overlapping portions of width equal to this overlapping projection range b. And these subpatterns TP1 through TP4 are respectively magnified by exactly the reciprocal of the pattern reduction ratio between the mask 50 and the wafer 60, and one each of the subpatterns which are obtained is provided to the plurality of small regions 54 of the mask 50.

In this connection, since the subpatterns TP1 through TP4 individually correspond to regions on the wafer 60 upon which the electron beam is incident, accordingly, on the small regions 54 of the mask 50, the irradiation limitation member 53 is removed from the portions that correspond to the subpatterns TP1 through TP4 and the mask base plate 51 thus becomes exposed. To take one example, the one of the small regions 54 which corresponds to the subpattern TP1 is shown in FIG. 8C. Moreover, in FIG. 8C, the irradiation limitation member 53 is shown by hatching. The portion which is defined between the broken line c and the single dotted chain line d corresponds to the overlapping projection range b of FIG. 8A, but as well on the outside thereof the irradiation limitation member 53 is removed up to the position of the boundary with the supporting post 52, so as to correspond to the portions which join together the subpattern TP1 and the subpatterns TP2 and TP3.

The amount by which the small regions 54 of the mask 50 shown in FIG. 8C should be irradiated by the electron beam is set as follows. First, the rectangular regions which are surrounded by the broken line c regions within the small regions 54 are supplied with a uniform amount of irradiation, and upon the outside thereof the amount of irradiation is decreased more with increasing distance from the centers of the small regions 54, so that at the position of the single dotted chain line d the amount of irradiation becomes almost zero. It is not necessary for the amount of irradiation to become absolutely zero at the position of the single dotted chain line d. In order to provide this type of irradiation amount characteristic, in these first preferred embodiments of the method and apparatus for pattern projection according to the present invention, the amount of electrical current flowing through the condenser lens 5 of FIG. 4 is set so as to ensure that the image of the first aperture 4 is cast upon the mask 50 in a defocused state, that is to say in a state in which its focusing is not perfect. Accordingly, the edge portion of the image of the aperture 4 which is directed upon the mask 50 is faded out so as to provide the above described irradiation amount characteristic. Moreover, another way of doing this other than by establishing a defocused state of the image of the first aperture 4 upon the mask 50 would be to vary the relative positions of the first aperture 4 and the mask 50 upon the optical axis. In this case it would be desirable, for example, to provide a mechanism which was able to shift the first aperture 4 along the direction of the optical axis. Since the range over which the amount of irradiation is reduced can be expanded or contracted according to the amount of defocusing, the size which is required for the first aperture 4 and the electric current flow in the condenser lens 5 are evaluated by simulation or the like, in order to make this range of reduction almost agree with the range between the broken line c and the single dotted chain line d in FIG. 8C, and the size of the first aperture 4 is set according to the results which are obtained. Further, the value for the electric current for the condenser lens 5 which has thus been obtained is stored in the memory device 25, and, when the mask 50 upon which the pattern has been imprinted as described above has been mounted upon the mask stage 7, this stored value is called in from the memory device 25 into the control device 24 as an electric current value which corresponds to this mask 50, and this value is commanded to the control power source 20. Further, when the image of the first aperture 4 is in the defocused state with respect to the mask 50, if undesirably the integrated value of the strength of the magnetic field over the space between the first aperture 4 and the mask 50 changes, then the image of the first aperture 4 upon the mask 50 will become undesirably rotated. For this reason the control device 24 should adjust the excitation of the rotating lens 15 via the control power source 20, in order to correct for this rotation of the image of the first aperture 4. Moreover, it would also be acceptable as an alternative to provide a mechanism which turns the first aperture 4 mechanically, instead of correcting the rotation of the image of the first aperture 4 by using this rotating lens 15.

When performing pattern projection with the pattern projection apparatus of FIG. 4 using the above described mask 50, the mask 50 is mounted upon the mask stage 7 so that the directions in which its small regions 54 line up agree with the x axis and the y axis of the projection apparatus. And the amount of deflection imparted to the electron beam by the deflectors 6A and 6B in the x axis direction and in the y axis direction is varied stepwise while continuously moving the mask 50 in the direction of the x axis at a suitable speed by the use of the mask stage 7, and thereby the electron beam irradiates each of the small regions 54 for a predetermined time period in order from one edge of the mask 50 to the opposite edge thereof. It is desirable for the speed of movement for the mask stage 7 and the amounts of deflection to be imparted by the deflectors 6A and 6B to be supplied to the memory device 25 in advance, and to be read out into the control device 24 as required and to be commanded to the mask stage 7 and the control power source 21. Simultaneously with the scanning of the mask 50 by the electron beam, the wafer stage 10 is continuously moved along the x axis in the opposite direction, and the images of the patterns on each of the small regions 54 are reduced and imaged to the projection reception regions of the wafer 60 which correspond to these small regions 54. At this time, for projection reception regions which adjoin one another in the x axis direction and in the y axis direction, the position of incidence of the electron beam upon the wafer 60 is adjusted so as mutually to superimpose the overlapping projection ranges b shown in FIG. 8A. In concrete terms, the position of incidence in the y axis direction is adjusted by the amount of deflection of the deflectors 11A and 11B, while the position of incidence in the x axis direction is adjusted by the position of the wafer stage 10 in the x axis direction and by the amount of deflection of the deflectors 11A and 11B. These amounts of deflection and this speed are given to the memory device 25 in advance, and are read out into the control device 24 as required and are commanded to the wafer stage 10 and to the control power source 22.

Preferred Embodiment 2

The second preferred embodiments of the method and apparatus for pattern projection using a beam of charged particles will now be explained with reference to FIGS. 9 and 10A–10E. In these second preferred embodiments, in the apparatus shown in FIG. 4, when each of the small regions 54 of the mask 50 is being illuminated by the electron beam, the value of the electrical current which is being supplied to the deflector 6A or the deflector 6B is periodically varied. As shown by way of example in FIG. 9, when the value of the electrical current which is required to flow through the deflector 6A in order to direct the electron beam upon a specific one of the small regions 54 is IO, then in fact a current is supplied to the deflector 6A of value equal to IO but with a high frequency saw tooth component additionally superimposed thereupon. Moreover, since as described above the deflector 6A comprises a pair of deflector coils, the electric current which is supplied to both of these coils is varied in a saw tooth manner. In a manner identical to the above, the second deflector 6B may be the object of this variation.

Figure 10A:
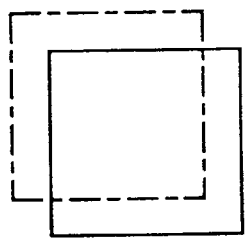
Figure 10B:
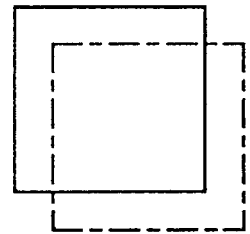
Figure 11:
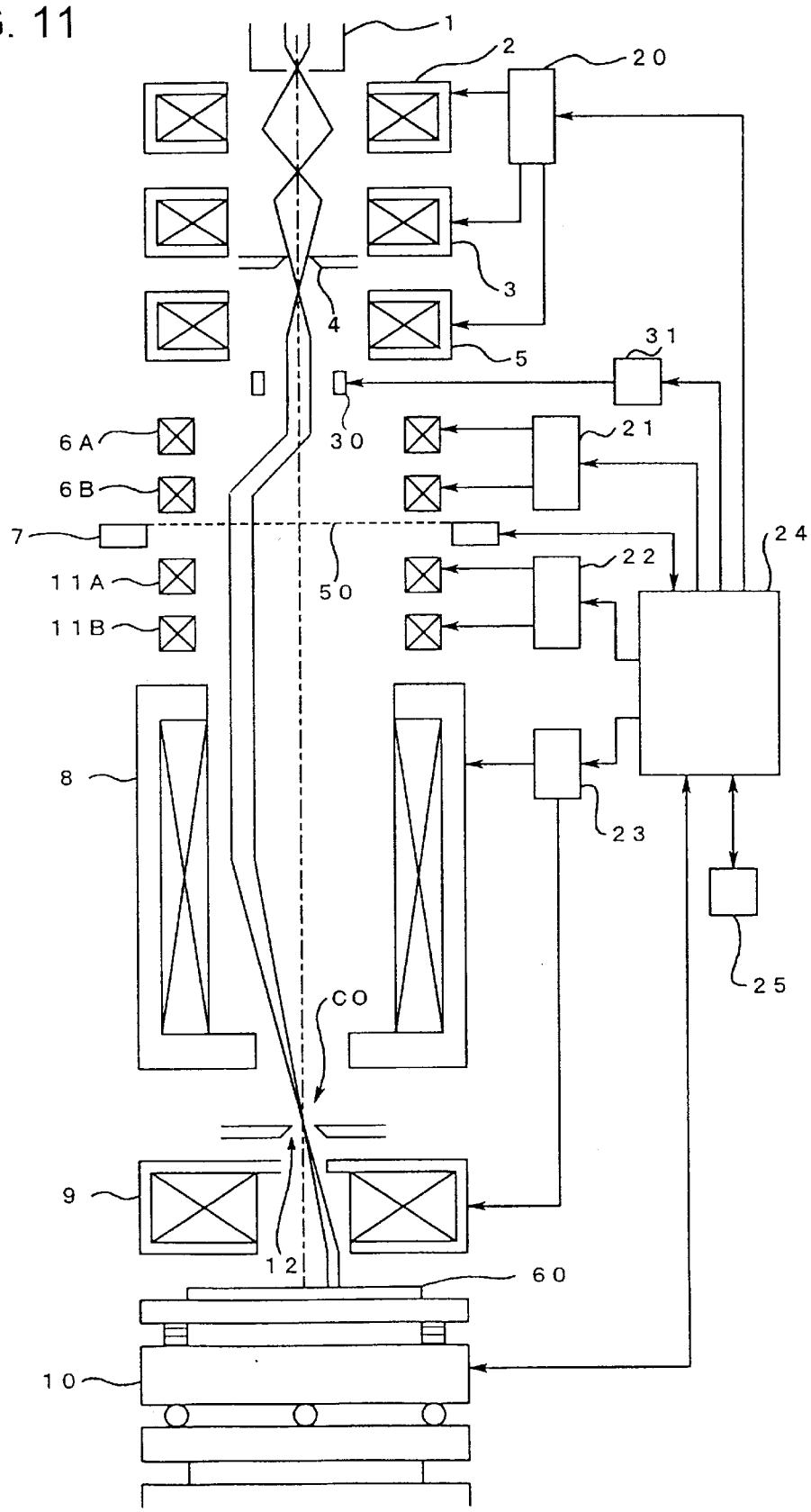
FIG. 11 is a figure similar to FIG. 4, showing an electron beam projection apparatus according to the second preferred embodiment of the apparatus of the present invention, which additionally incorporates an electrostatic deflector.
Figure 12A:
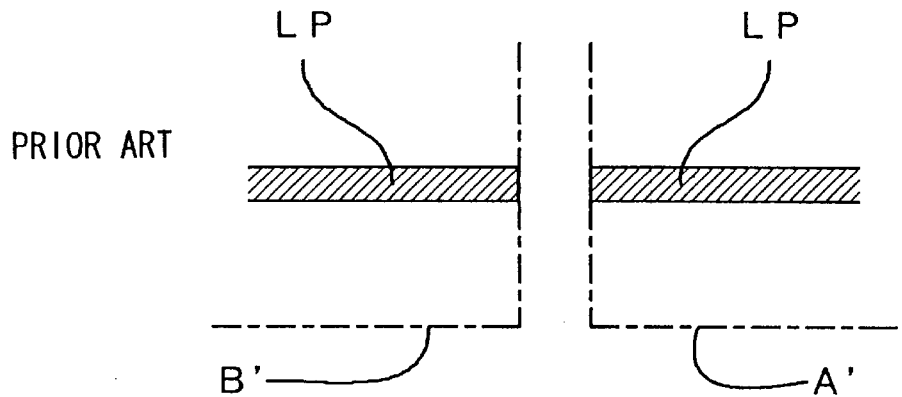
FIGS. 12A–12C are figures for explaining problems associated with pattern projection methods and apparatuses according to the prior art.
Figure 12B:
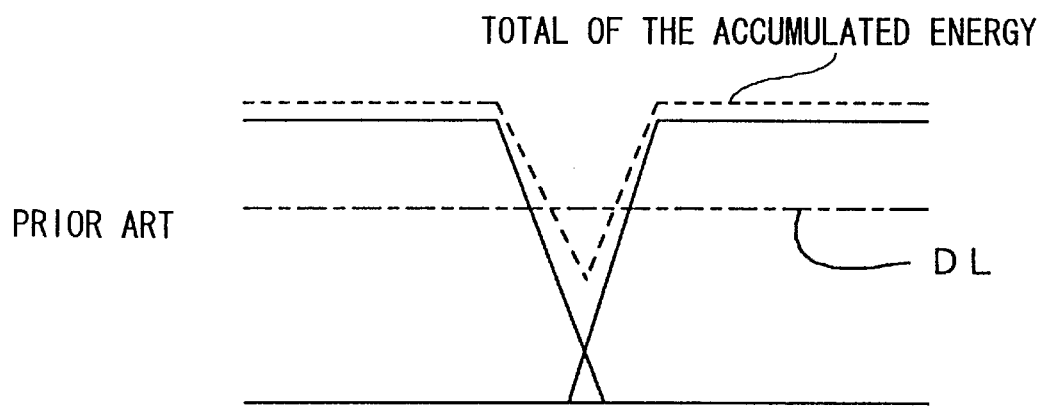
Figure 12C:
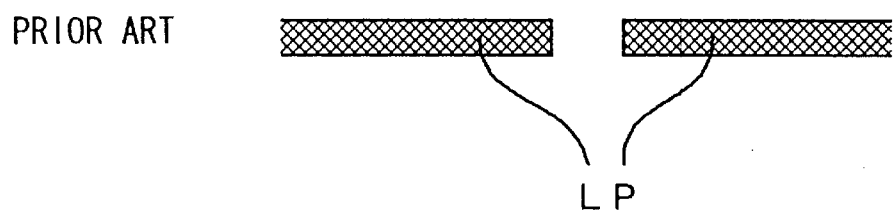

According to the above described operation, as the electron beam irradiates the small regions 54 one by one, the range of irradiation by the electron beam is unceasingly varied. This situation is schematically shown in FIGS. 10A–10E. The solid lines in FIGS. 10A through 10C show the range of irradiation by the electron beam (hereinafter simply termed the range of irradiation) when an electrical current value equal to IO is supplied to the deflector 6A, while the single dotted chain lines in each of FIGS. 10A and 10B show the situation in which the actual range of irradiation has deviated. Since the actual position of irradiation varies periodically along the directions of the x axis and the y axis due to change of the electric current which is supplied to the deflector 6A, finally, as shown in FIG. 10C, the electron beam provides irradiation over a band (the region shown by hatching) up to a predetermined width on the outside of the basic range of irradiation of the electron beam, and the level of irradiation in this band is reduced steadily towards its outside edge, as shown in FIGS. 10D and 10E. Accordingly, if the size of the first aperture 4, the size of the small regions 54 of the mask 50, and the width of variation of the electric current for deflection are set so that the basic range of irradiation coincides with the range which is surrounded by the broken line c in FIG. 8C, and so that the range of irradiation on the outside thereof coincides with the range which is defined between the broken line c and the single dotted chain line d, then pattern projection may be performed in a manner identical to that performed with the first preferred embodiments described above. Moreover, there is no requirement for the image of the aperture to be defocused. If the response of the deflectors 6A and 6B of FIG. 4 is unduly slow, then it will be acceptable, as shown in FIG. 11, to add an electrostatic deflector 30 which is separate from the deflectors 6A and 6B, and to vary the voltage which is supplied from a control power source 31 to this electrostatic deflector 30 in a saw tooth pattern according to commands from the control device 24. Further, the present invention is not to be considered as being limited to the case in which the currents and voltages which are supplied to the deflectors 6A and 6B and the electrostatic deflector 30 are varied in a saw tooth fashion; it will be sufficient for the amount of deflection—in other words the range of irradiation—over a single one of the small regions of the mask to be varied periodically during the process of irradiation by the electron beam.

FIGS. 4 through 11 which were used above for explanation of the details of the preferred embodiments of the present invention are schematic views, and do not necessarily accurately reflect the relative dimensions of the various actual parts of this projection apparatus and the mask, etc. used therein. The present invention also is not restricted to the use of an electron beam; an ion beam or the like may also be used.

Figure 13:
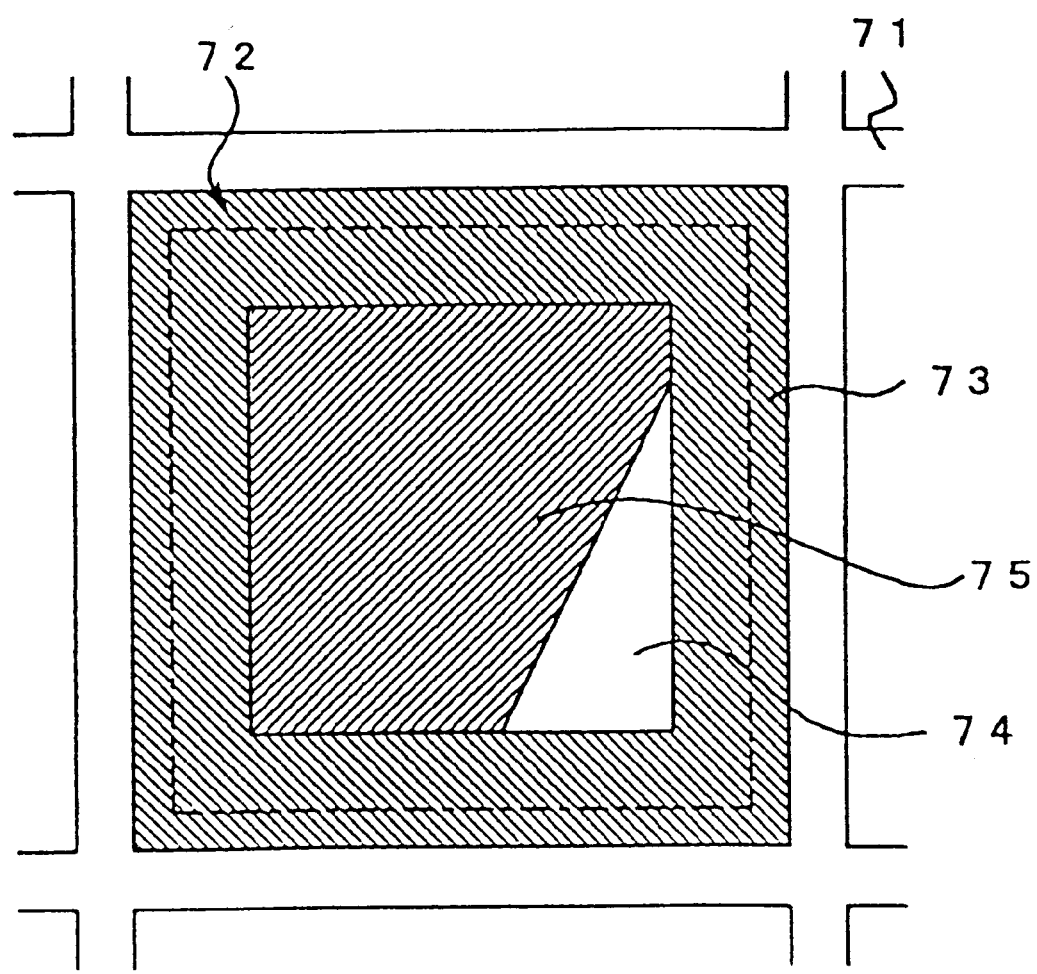
FIG. 13 is a plan view of a mask which is used in such prior art pattern projection methods and devices.
Figure 14:
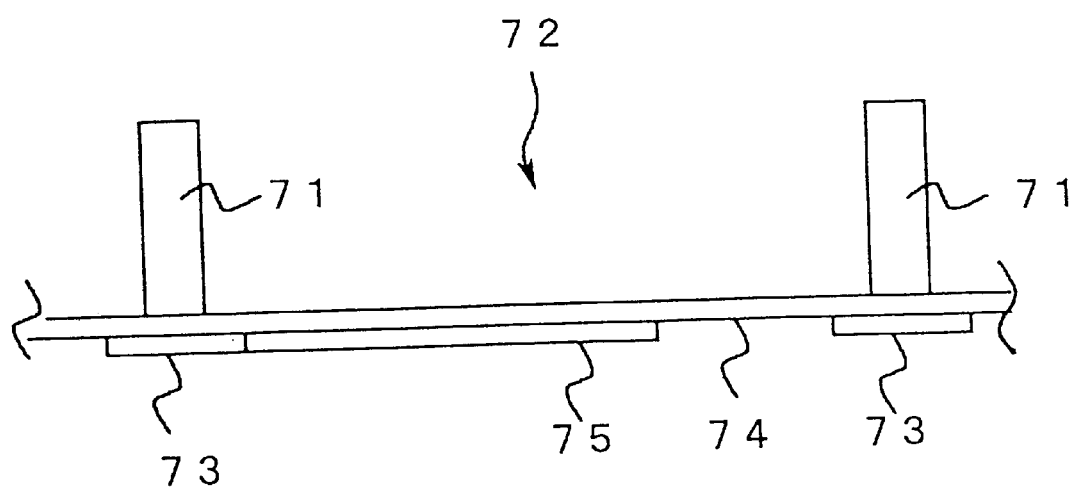
FIG. 14 is a sectional view through the FIG. 13 prior art mask.

Moreover, in the case of the mask according to the mask aspect of the present invention which is used in the preferred method and apparatus embodiments of the present invention, the boundary portions between the small regions and the supporting structure are more clearly distinguished, as compared to the case of a prior art mask which is used in prior art methods and apparatuses for pattern projection using a beam of charged particles. In prior art methods, apparatuses, and masks, as shown in FIGS. 13 and 14, a skirt 73 which scatters or absorbs the electron beam is arranged so as to extend uniformly inwards towards the inside portion of the small regions 72 over a predetermined range from the supporting structure 71 for the mask 70, and the irradiation control member 75 is disposed upon the mask base plate 74 upon the inside of this skirt 73 in suitable correspondence to the pattern for projection. And the irradiation range for the electron beam is set somewhat greater than the inner boundary of the skirt 73, so as to be as shown by the single dotted chain line in the figure, and thereby, along with making more clear the positions of the boundaries of the regions of the wafer which are to be imaged in correspondence with each of the small regions, the electron beam is prevented from irradiating the support structure 71. However, since in the above described preferred embodiments of the present invention the amount of irradiation by the electron beam is gradually decreased over the circumferential portions of the small regions 54, there is no requirement to provide any such skirt as in the prior art mask described above, and the pattern for projection may be provided all the way up to the boundary between the small regions 54 and the supporting structure 52.

Yet further, although in the above described preferred embodiments of the present invention the construction of the mask 50 was such that the small regions 54 were mutually separated by the supporting post 52, this is not to be considered as limitative of the present invention; it would also be acceptable, as an alternative, to construct the mask 50 with no such supporting post 52, so that the small regions 54 were continuous.

What is claimed is:

1. A method for pattern projection using a beam of charged particles, comprising:

a process of making a pattern of a beam of charged particles, wherein a beam of charged particles is irradiated upon a small region which is selected among a plurality of small regions upon a mask, and said beam of charged particles is caused to change by the influence of a pattern which is provided on said small region;

a process of projection, wherein said pattern of the beam of charged particles is projected upon a certain portion of a projection reception region which is defined upon a sensitive plate, whereby the pattern of said small region is imaged upon said certain portion;

a process of scanning, wherein said small region and said certain portion which corresponds thereto are selected in sequence, the patterns of said selected small regions are projected upon said selected certain portions, and a predetermined pattern is formed upon said sensitive plate by connecting said projected patterns in sequence; and a process of irradiation amount reduction, wherein, during the projection of said pattern of said selected small region on said scanning process, the amount of irradiation by said beam of charged particles of the peripheral portion of each one of said plurality of small regions is steadily reduced in correspondence to the distance from the center of said one of said small regions, wherein said small regions on said mask and said certain portions of said projection reception regions on said sensitive plate are scanned so as to establish a mutual correspondence so that at least portions of the regions for which the amount of irradiation by said beam of charged particles is reduced by said process of irradiation amount reduction, from a pair of said certain portions of said projection reception region upon said sensitive plate which mutually neighbor one another, are mutually superimposed.

2. A method for pattern projection using a beam of charged particles according to claim 1, wherein compatible patterns are provided upon said peripheral portions of said small regions upon said mask which correspond to said pair of said certain portions of said projection reception region upon said sensitive plate.

3. A method for pattern projection using a beam of charged particles according to claim 1, wherein said irradiation amount reduction process includes the process of projecting in a defocused condition upon said mask an image of an aperture which forms said beam of charged particles which is directed upon said mask in a cross sectional shape which corresponds to said small regions.

4. A method for pattern projection using a beam of charged particles according to claim 3, wherein said defocusing is performed by altering the relative positions of said aperture and said mask in the direction of an optical axis.

5. A method for pattern projection using a beam of charged particles according to claim 4, wherein said image of said aperture which is projected upon said mask is rotated.

6. A method for pattern projection using a beam of charged particles according to claim 1, wherein said irradiation amount reduction process includes the process of oscillating in a direction parallel to said mask surface said beam of charged particles which is directed upon a single small region of said mask.

7. A mask for pattern projection using a beam of charged particles comprising:

a plurality of small regions, a pattern being provided upon each of said plurality of small regions which imparts a predetermined alternation to a beam of charged particles which has passed through said small region, wherein said pattern is repeated, for superimposition by exposure, upon peripheral portions of a pair of said small regions upon which patterns which are continuous with one another are provided.

8. A mask for pattern projection using a beam of charged particles according to claim 7, wherein the mask is an irradiation amount reduction mask in which a process of an amount of irradiation by said beam of charged particles of the peripheral portion of each one of said plurality of small regions is steadily reduced in correspondence to a distance from a center of said one of said small regions during the pattern projection.

9. A mask for pattern projection using a beam of charged particles, comprising a mask base plate; and a support structure which supports said mask base plate and separates said mask base plate into a plurality of small regions, wherein said small regions have first regions through which said beam of charged particles passes, and second regions in which the degree of absorption or of scattering of said beam of charged particles is greater than in said first regions, said first regions contacting boundaries between said small regions and said support structure.

10. A mask for pattern projection using a beam of charged particles according to claim 9, wherein said pattern is repeated, for superimposition by exposure, upon peripheral portions of a pair of said small regions upon which patterns which are continuous with one another are provided, and the mask is an irradiation amount reduction mask in which a process of an amount of irradiation by said beam of charged particles of the peripheral portion of each one of said plurality of small regions is steadily reduced in correspondence to a distance from a center of said one of said small regions during the pattern projection.

11. A mask for pattern projection using a beam of charged particles, comprising:

a mask base plate which is formed as a thin sheet;

a support structure which supports said mask base plate and which separates said mask base plate into a plurality of small region; and an irradiation control member which is disposed in said small regions of said mask base plate and which absorbs or scatters said beam of charged particles more than does said mask base plate, wherein transparent regions in which said irradiation control member does not exist are provided which contact the boundaries between said small regions and said support structure.

12. A mask for pattern projection using a beam of charged particles according to claim 11, wherein said pattern is repeated, for superimposition by exposure, upon peripheral portions of a pair of said small regions upon which patterns which are continuous with one another are provided, and the mask is an irradiation amount reduction mask in which a process of an amount of irradiation by said beam of charged particles of the peripheral portion of each one of said plurality of small regions is steadily reduced in correspondence to a distance from a center of said one of said small regions during the pattern projection.

* * * * *